(12) United States Patent
Deng et al.

(10) Patent No.: US 11,309,869 B1
(45) Date of Patent: Apr. 19, 2022

(54) OSCILLATING SIGNAL GENERATOR AND FILTER CIRCUIT

(71) Applicant: REALTEK SEMICONDUCTOR CORPORATION, Hsinchu (TW)

(72) Inventors: Ping-Yuan Deng, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/189,057

(22) Filed: Mar. 1, 2021

(30) Foreign Application Priority Data

Nov. 10, 2020 (TW) ................................. 109139174

(51) Int. Cl.
*H03H 11/04* (2006.01)
*H03H 7/01* (2006.01)
(Continued)

(52) U.S. Cl.
CPC ............... *H03H 11/04* (2013.01); *H03B 5/02* (2013.01); *H03H 7/0161* (2013.01);
(Continued)

(58) Field of Classification Search
CPC ...... H03B 21/00–04; H03B 2200/0074; H03H 7/0138; H03H 7/0153; H03H 7/0161;
(Continued)

(56) References Cited

U.S. PATENT DOCUMENTS 7,515,931 B2 4/2009 Olip
8,121,214 B2 2/2012 Tal et al.
(Continued)

FOREIGN PATENT DOCUMENTS

WO  WO2007035000 A1  3/2007

OTHER PUBLICATIONS

Hooman Darabi, Janice Chiu, Shahla Khorram, Hea Joung Kim, Zhirnin Zhou, Hung-Ming (Ed) Chien, Brirna Ibrahim, E. Geronaga, Long H. Tran, and Ahmadreza Rofougaran, A dual-mode 802.11b/Bluetooth radio in 0.35-μm COMS, IEEE Journal of Solid-State Circuit, vol. 40, No. 3, Mar. 2005.
(Continued)

*Primary Examiner* — Levi Gannon
(74) *Attorney, Agent, or Firm* — WPAT, P.C., Intellectual Property Attorneys; Anthony King

(57) ABSTRACT

A filtering circuit includes a filter, a frequency divider, and a control circuit. The filter is configured to generate a first oscillating signal according to a control signal in a first mode, and perform a filtering process according to the control signal in a second mode. A frequency of the first oscillating signal is determined according to the control signal. The frequency divider is coupled to the filter and configured to divide the frequency of the first oscillating signal to generate a frequency-divided signal. The control circuit is coupled to the filter and the frequency divider, and configured to compare a frequency of the frequency-divided signal and a frequency of a second oscillating signal so as to adjust the control signal in the first mode. A center frequency of a passband of the filter in the second mode is determined according to the adjusted control signal.

20 Claims, 3 Drawing Sheets

(51) Int. Cl.
*H03K 5/00* (2006.01)
*H03B 5/02* (2006.01)

(52) U.S. Cl.
CPC ... *H03K 5/00006* (2013.01); *H03H 2210/012* (2013.01); *H03H 2210/025* (2013.01); *H03H 2210/026* (2013.01)

(58) Field of Classification Search
CPC ........... H03H 2007/0192; H03H 11/04; H03H 17/0294; H03H 2017/0295; H03H 2017/0297; H03H 2210/012; H03H 2210/02; H03H 2210/021; H03H 2210/025; H03H 2210/026; H03H 2210/03; H03H 2210/033; H03H 2210/036; H03H 2210/04; H03K 5/00006; H03L 7/24; H04B 1/0475; H04B 1/10
See application file for complete search history.

(56) References Cited

U.S. PATENT DOCUMENTS

| 9,548,774 | B2 | 1/2017 | Lin et al. | |
|---|---|---|---|---|
| 2008/0252365 | A1* | 10/2008 | Tu | H03H 11/0433 327/553 |
| 2010/0259305 | A1* | 10/2010 | Lee | H03L 7/23 327/157 |
| 2017/0117907 | A1* | 4/2017 | Grollitsch | H03K 3/0322 |
| 2020/0162084 | A1* | 5/2020 | Darabi | H03B 5/32 |

OTHER PUBLICATIONS

Hooman Darabi, Janice Chiu, Shahla Khorram, Hea Joung Kim, Zhimin Zhou, Hung-Ming (Ed) Chien, Brima Ibrahim, E. Geronaga, Long H. Tran, and Ahmadreza Rofougaran, A dual-mode 802.11b/ Bluetooth radio in 0.35-μm COMS, IEEE Journal of Solid-State Circuit, vol. 40, No. 3, Mar. 2005.

* cited by examiner

OSCILLATING SIGNAL GENERATOR AND FILTER CIRCUIT

CROSS-REFERENCE TO RELATED APPLICATIONS

This application claims the benefit of priority to Patent Application No. 109139174, filed in Taiwan on Nov. 10, 2020, which is incorporated by reference in its entirety.

TECHNICAL FIELD

The present application relates to a signal generation circuit; in particular, to an oscillating signal generation circuit including a filtering circuit.

BACKGROUND

When a direct up-conversion transmitter generates an output signal, a voltage-controlled oscillator is used to generate the signal to a mixer, which in turn generates a mixing the signal including the main frequency, and then a filter is used to retain the signal with the main frequency and eliminate unwanted harmonics. However, when the mixing signal has a larger bandwidth, the center frequency of the filter is usually selected by adjusting the current of the buffer amplifier in connection with the amplitude detection followed by the application of an appropriate algorithm. These conventional approaches are quite time-consuming, and unwanted harmonics in the mixing signal would affect the amplitude detection and reduce the accuracy. Therefore, how to select the center frequency of a filter quickly and accurately has become one of the most important issue to be solved in this field.

SUMMARY OF THE INVENTION

An aspect of the present disclosure provide a filtering circuit including a filter, a frequency divider, and a control circuit. The filter is configured to generate a first oscillating signal according to a control signal in a first mode, and perform a filtering process according to the control signal in a second mode. A frequency of the first oscillating signal is determined according to the control signal. The frequency divider is coupled to the filter and configured to divide the frequency of the first oscillating signal to generate a frequency-divided signal. The control circuit is coupled to the filter and the frequency divider, and configured to compare a frequency of the frequency-divided signal and a frequency of a second oscillating signal so as to adjust the control signal in the first mode. A center frequency of a passband of the filter in the second mode is determined according to the adjusted control signal.

Another aspect of the present disclosure provide an oscillating signal generation circuit including a filtering circuit and an oscillator circuit. The filtering circuit is configured to generate a first oscillating signal in a first mode, receive a second oscillating signal to adjust a frequency of the first oscillating signal, and perform a filtering process on an input signal to generate an output signal in a second mode. A center frequency of a passband of the filtering circuit is determined according to the frequency of the adjusted first oscillating signal. The oscillator circuit is coupled to the filtering circuit and configured to receive the second oscillating signal to generate the input signal.

Compared with conventional approaches, the oscillating signal generation circuit according to the present application can select the center frequency of the filter dynamically and rapidly, so as to reduce the time occupied by the selection of the center frequency and reduce the effect of harmonics on amplitude sensing, thereby improving the accuracy.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of some features may be arbitrarily increased or reduced for clarity of discussion.

DETAILED DESCRIPTION

When discussing the frequency of a signal in this application, one of ordinary skill in the art should understand that said frequency is the highest intensity of the bandwidth of the signal, e.g., said frequency is the position where the peak of the signal is located after the Fourier transform, where said bandwidth is the full width at half maximum (FWHM) of the frequency distribution of said signal. In some embodiments, the frequency is the center frequency of the signal. Therefore, when discussing the frequency of a signal in this application, it does not mean that the signal only has said frequency; rather, the signal may have other frequency components.

Figure 1:
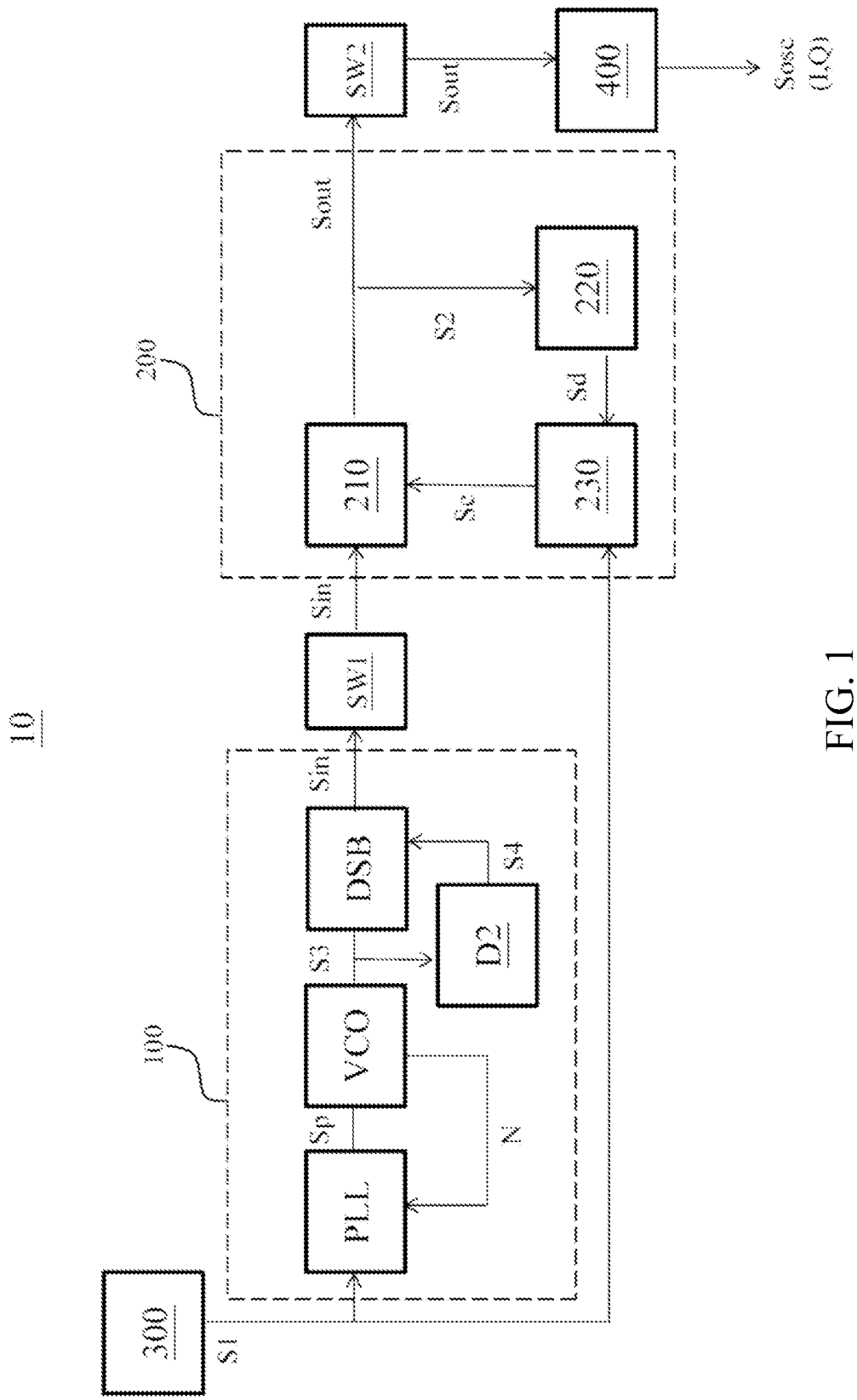
FIG. 1 is a schematic diagram illustrating an oscillating signal generation circuit according to some embodiments of the present application.

FIG. 1 is a schematic diagram illustrating an oscillating signal generation circuit 10 according to some embodiments of the present application. The oscillating signal generation circuit 10 can be operated in a first mode and a second mode and is configured to generate an oscillating signal Sosc, such as the local oscillating signal having the in-phase signal I and the orthogonal signal Q. For example, in the first mode, the oscillating signal generation circuit 10 can select (or determine) the frequency of the oscillating signal Sosc according to the oscillating signal S1. In the second mode, the oscillating signal generation circuit 10 can generate the oscillating signal Sosc according to the oscillating signal S1 and the selected/determined frequency.

To facilitate the understanding, the first mode and the second mode are respectively referred to as the calibration mode and the general mode. However, the present application is not limited thereto. In the present embodiment, in the calibration mode, the oscillating signal generation circuit 10 is configured to generate the oscillating signal S2 according to the oscillating signal S1, and in the general mode, the oscillating signal generation circuit 10 is configured to determine the frequency fout of the output signal Sout according to the frequency f2 of the oscillating signal S2. In the general mode, the oscillating signal generation circuit 10 can generate the output signal Sout according to the oscillating signal S1 and the frequency fout determined in the calibration mode, so as to generate the oscillating signal Sosc. In other words, the frequency of the oscillating signal Sosc can be determined/calibrated in the calibration mode in advance.

For example, when activating the oscillating signal generation circuit 10, the oscillating signal generation circuit 10 first enters the calibration mode. In the calibration mode, the oscillating signal generation circuit 10 first determines the frequency f2 of the oscillating signal S2 matching the frequency f1 of the oscillating signal S1 according to the oscillating signal S1, and then the oscillating signal generation circuit 10 enters the general mode. In this way, the oscillating signal generation circuit 10 can obtain the output signal Sout according to the frequency f2 of the oscillating signal S2 in the general mode.

As shown in FIG. 1, the oscillating signal generation circuit 10 includes an oscillator circuit 100, a filtering circuit 200 and an oscillating source 300 (e.g., a crystal oscillator). The oscillator circuit 100 is coupled to the oscillating source 300, and the filtering circuit 200 is coupled to the oscillator circuit 100. The filtering circuit 200 is further coupled to the oscillating source 300.

In the general mode, the oscillator circuit 100 is configured to generate the input signal Sin according to the oscillating signal S1, wherein the input signal Sin has a frequency fin. The oscillator circuit 100 includes a phase-locked loop PLL, an oscillator VCO, a frequency division circuit D2 and a mixer DSB. The phase-locked loop PLL receives the oscillating signal S1 and the frequency control signal N fed back from the oscillator VCO, so as to generate a pulse signal Sp. The oscillator VCO generates an oscillating signal S3 according to the pulse signal Sp. The frequency division circuit D2 divides the frequency of the oscillating signal S3 to generate an oscillating signal S4. The mixer DSB is configured to mix the oscillating signal S3 and the oscillating signal S4, so as to generate an input signal Sin. In some embodiments, the frequency fin equals to the sum of the frequency f3 of the oscillating signal S3 and the frequency f4 of the oscillating signal S4; that is, the input signal Sin is a sum frequency signal of the oscillating signal S3 and the oscillating signal S4. In some embodiments, the frequency division circuit D2 divides the frequency f3 of the oscillating signal S3 by 2 to generate the oscillating signal S4; that is, the frequency f4 is half of the frequency f3.

As shown in FIG. 1, the filtering circuit 200 includes a filter 210, a frequency divider 220 and a control circuit 230. The filter 210 is coupled to the mixer DSB in the oscillator circuit 100, the frequency divider 220 and the control circuit 230, the frequency divider 220 is coupled to the control circuit 230, and the control circuit 230 is further coupled to the oscillating source 300.

In the general mode, the filtering circuit 200 is configured to filter the input signal Sin to generate an output signal Sout. The filter 210 receives the input signal Sin and filters the input signal Sin according to the passband of the filter 210, so as to generate the output signal Sout. In some embodiments, the filter 210 can be implemented as a band pass filter. In some embodiments, the filter 210 is further used as an amplifier, which is configured to amplify the input signal Sin.

In the calibration mode, the filtering circuit 200 generates the oscillating signal S2 according to the oscillating signal S1. The frequency divider 220 is configured to divide the frequency of the oscillating signal S2 according to a frequency division, so as to generate a frequency-divided signal Sd. The control circuit 230 is configured to receive the oscillating signal S1 and generate a control signal Sc according to the frequency-divided signal Sd and the oscillating signal S1. The filter 210 further determines the frequency f2 of the oscillating signal S2 according to the control signal Sc, so as to adjust the updated oscillating signal S2.

In some embodiments, the oscillating signal generation circuit 10 further includes an oscillating signal generator 400, such as an I/Q signal generator capable of dividing an oscillating signal into an in-phase portion and an orthogonal portion. As shown in FIG. 1, in the general mode, the oscillating signal generator 400 receives the output signal Sout and generates the an in-phase signal I and an orthogonal signal Q accordingly.

In some embodiments, the oscillating signal generation circuit 10 further includes an input switch SW1 and an output switch SW2. The input switch SW1 is coupled between the oscillator circuit 100 and the filtering circuit 200, and the output switch SW2 is coupled between the filtering circuit 200 and the oscillating signal generator 400. The input switch SW1 and the output switch SW2 are switched off in the calibration mode and conducted in the general mode. In some embodiments, at least one of the input switch SW1 and the output switch SW2 can be included in the filter 200. In some embodiments, the input switch SW1 can be integrated in the filter 200.

Figure 2:
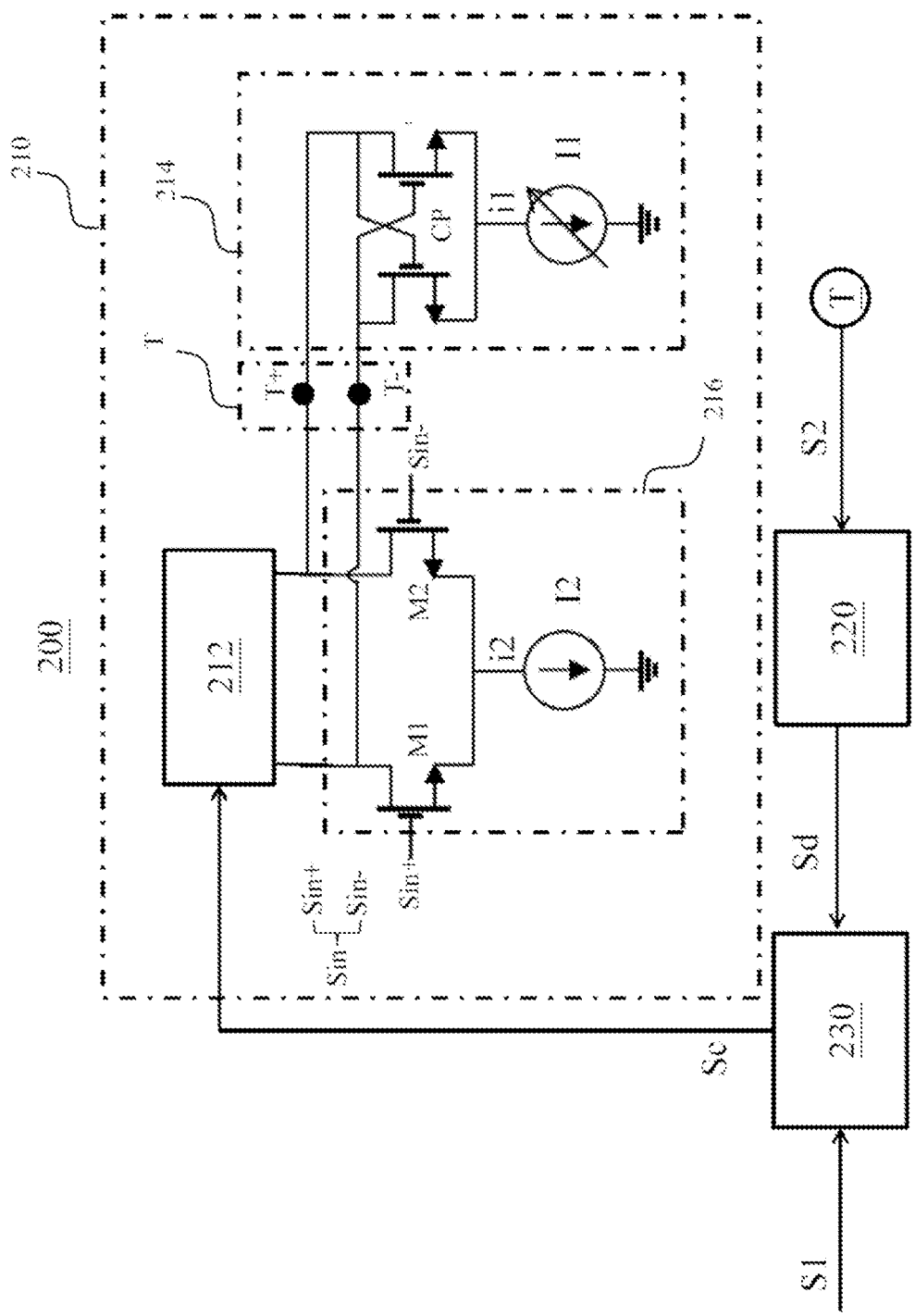
FIG. 2 is a schematic diagram illustrating a filtering circuit according to some embodiments of the present application.

Reference is made to FIG. 2. FIG. 2 is a schematic diagram illustrating the details of the filtering circuit 200 according to the embodiments shown in FIG. 1. The filter 210 in the filtering circuit 200 includes an output terminal T, a frequency selection circuit 212, an oscillation-starting circuit 214 and an amplifier circuit 216. As shown in FIG. 2, in the filter 210, the frequency selection circuit 212, the oscillation-starting circuit 214 and the amplifier circuit 216 are coupled to the output terminal T. The frequency divider 220 is coupled to the filter 210 at the output terminal T. The control circuit 230 is coupled to the frequency selection circuit 212 to provide the control signal Sc.

In the calibration mode, the frequency selection circuit 212 sets the frequency f2 of the oscillating signal S2 according to the control signal Sc, and the oscillation-starting circuit 214 is configured to provide a current (shown as the bias current i1) to the frequency selection circuit 212 through the output terminal T, so as to generate the oscillating signal S2 at the output terminal T. The oscillation-starting circuit 214 can generate an oscillating signal S2 according to the frequency f2 set by the frequency selection circuit 212.

In some embodiments, the frequency selection circuit 212 can be implemented using a resonant cavity. The frequency f2 of the oscillating signal S2 may equal to the resonant frequency of the resonant cavity. In some embodiments, the resonant cavity can be an inductor-capacitor resonant cavity having a variable capacitor and inductor. In some embodiments, the frequency selection circuit 212 adjusts the capacitance of the variable capacitor according to the control signal Sc, so as to adjust the resonant frequency of the resonant cavity. For example, the control signal Sc can be implemented by using a frequency control word (FCW).

In some embodiments, the oscillation-starting circuit 214 includes a cross-coupling transistor pair CP and a current source I1. The cross-coupling transistor pair CP is coupled between the output terminal T and the current source I1. The current source I1 is configured to provide the bias current i1, and the cross-coupling transistor pair CP is configured to generate the oscillating signal S2 at the output terminal T according to the bias current i1.

In the calibration mode, the amplifier circuit 216 can be switched off so that it the signal amplification operation is stopped. For example, the amplifier circuit 216 can stop providing a current (shown as the bias current i2). Since the amplifier circuit 216 is switched off in the calibration mode, the output terminal T, the frequency selection circuit 212 and the oscillation-starting circuit 214 are operated as the voltage-controlled oscillator, which adjusts the generate frequency f2 of the oscillating signal S2 by means of the control signal Sc (see below for detailed discussion).

In the calibration mode, the control circuit 230 compares the frequency f1 of the oscillating signal S1 and the frequency fd of the frequency-divided signal Sd. When the frequency fd is greater than the frequency f1, the control circuit 230 can adjust the control signal Sc, so as to decrease the frequency set by the frequency selection circuit 212, and therefore, the frequency f2 of the oscillating signal S2 that the oscillation-starting circuit 214 generates at the output terminal T decreases. When the frequency fd is smaller than the frequency f1, the control circuit 230 can adjust the control signal Sc, so as to increase the frequency that the frequency selection circuit 212 sets, and therefore, the frequency f2 of the oscillating signal S2 that the oscillation-starting circuit 214 generates at the output terminal T increases. In other words, the control circuit 230 can determine whether to increase or decrease the frequency f2 of the oscillating signal S2 according to the frequency fd of the frequency-divided signal Sd. In some embodiments, the frequency f2 of the oscillating signal S2 can be adjusted to be equal to or substantially equal to the center frequency which is pre-determined by the filter 210 determines and will be used by the filter 210.

It is possible that the center frequency pre-determined by the filter 210 is greater than the frequency f1 of the oscillating signal S1. In order to allow the control circuit 230 to determine the value of the frequency f2 of the oscillating signal S2, the frequency divider 220 divides the frequency of the oscillating signal S2 first so that the frequency fd of the frequency-divided signal Sd approaches the frequency f1 of the oscillating signal S1.

In some embodiments, the current value of the bias current i1 generated by the current source I1 in the calibration mode is greater than a threshold value. When the current value of the bias current i1 is greater than the threshold value, the oscillation-starting circuit 214 is in the oscillating state, so as to generate the oscillating signal S2 at the output terminal T. In other words, the bias current i1 having a current value greater than the threshold value allows the frequency selection circuit 212 and the oscillation-starting circuit 214 to operate as an oscillator, so as to generate the oscillating signal S2. Moreover, when the current value of the bias current i1 is smaller than the threshold value, the oscillation-starting circuit 214 is in a non-oscillating state. The bias current i1 having a current value smaller than the threshold value is insufficient to allow the frequency selection circuit 212 and the oscillation-starting circuit 214 to operate as an oscillator.

In the general mode, the amplifier circuit 216 is configured to receive the input signal Sin and provides a current (shown as the bias current i2) to the frequency selection circuit 212 through the output terminal T, so as to amplify the input signal Sin and generate at least a portion of the output signal Sout at the output terminal T. The filter 210 can perform filtering process on the input signal Sin according to the frequency f2 of the oscillating signal S2 that the frequency selection circuit 212 set in the calibration mode. The output signal Sout obtained by performing filtering process on the input signal Sin is outputted at the output terminal T.

In the present embodiment, the amplifier circuit 216 includes a transistor M1, a transistor M2 and a current source 12, wherein both the transistor M1 and the transistor M2 are coupled between the output terminal T and the current source 12. The control terminals of the transistor M1 and the transistor M2 are configured to receive the input signal Sin and amplify the input signal Sin according to the bias current i2 provided by the current source 12, and filter the input signal Sin according to the frequency f2 set by the frequency selection circuit 212 (e.g., the center frequency which is pre-determined by the filter 210 and will be used by the filter 210). After the input signal Sin passes the amplifier circuit 216, the frequency fout of the corresponding the output signal Sout is within the frequency range covered by the passband of the filter 210. In some embodiments, since the center frequency of the passband equals to or substantially equals to the frequency f2 of the oscillating signal S2, the frequency fout of the output signal Sout equals to or substantially equals to the frequency f2.

In the general mode, the oscillation function of the oscillation-starting circuit 214 is disabled. For example, in some embodiments, the oscillation-starting circuit 214 stops providing the bias current i1 to the frequency selection circuit 212. For another example, in some embodiments, the oscillation-starting circuit 214 provides the bias current it having the current value smaller than the threshold value to the frequency selection circuit 212, so that the oscillation-starting circuit 214 cannot perform the oscillation function. When the current value of the bias current it is smaller than the threshold value and the oscillation function of the oscillation-starting circuit 214 is disabled, the bias current i1 is provided to the amplifier circuit 216 through the output terminal T, so that the oscillation-starting circuit 214 can generate a portion of the output signal Sout at the output terminal T. It is noted that, the oscillation-starting circuit 214 can be connected to the negative resistor of the output terminal T and provide additional gain, so as to increase the quality factor (Q factor) of the frequency selection circuit 212.

In some embodiments, the input signal Sin and the output signal Sout is a differential pair signal. The positive input signal Sin+ and the negative input signal Sin− of the input signal Sin are inputted to the control terminal of the transistor M1 and the control terminal of the transistor M2, respectively, whereas the amplifier circuit 216 is used as a differential amplifier circuit. The output terminal T includes the positive terminal T+ and the negative terminal T− that are respectively configured to output the positive output signal Sout+ and the negative output signal Sout− of the output signal Sout. In some embodiments, the frequency divider 220 is coupled to at least one of the positive terminal T+ and the negative terminal T−. The frequency divider 220 generates the frequency-divided signal Sd according to at least a portion of the oscillating signal S2.

Figure 3:
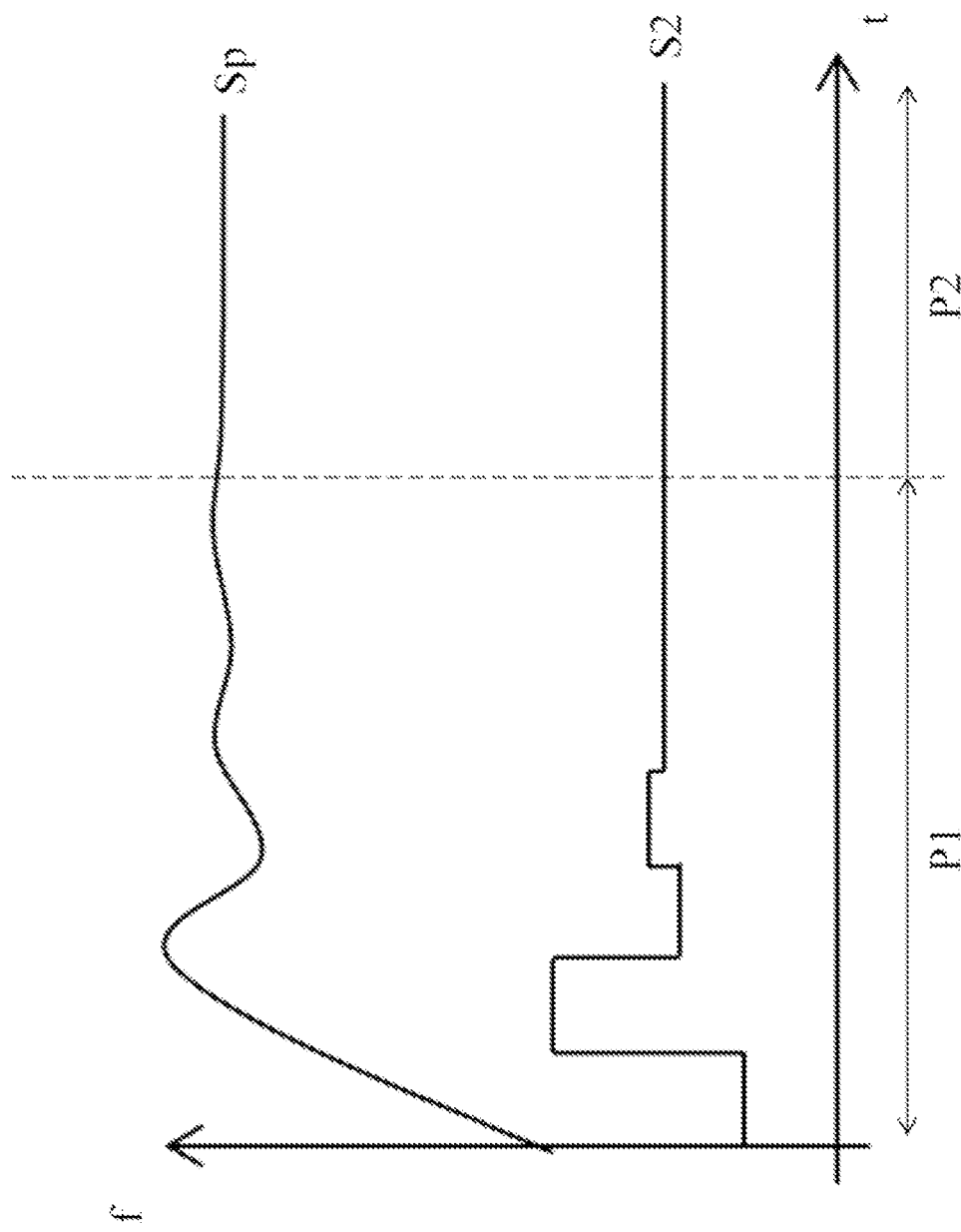
FIG. 3 is a schematic diagram illustrating the operation of an oscillating signal generation circuit according to some embodiments of the present application.

Reference is made to FIG. 3. FIG. 3 is a schematic diagram illustrating the operation of the oscillating signal generation circuit 10. FIG. 3 shows the mapping of the pulse signal Sp and the oscillating signal S2 in the calibration mode and general mode, wherein the horizontal axis represents the time t, the vertical axis represents the frequency f, the period P1 represents the calibration mode, and the period P2 represents the general mode.

Before the oscillating signal generation circuit 10 enters the general mode, the phase-locked loop PLL first locks the frequency of the pulse signal Sp and then locks the frequency fin of the input signal Sin accordingly, whereas the filtering circuit 200 determines/calibrates the center frequency of the passband by setting the frequency f2 of the oscillating signal S2. Therefore, the oscillating signal generation circuit 10 operates in the calibration mode during the period P1, so that the phase-locked loop PLL locks the frequency fin, and the filtering circuit 200 determines the frequency f2. Because the frequency fin and the frequency f2 are known, after the input switch SW1 is conducted, the oscillating signal generation circuit 10 enters the general mode (as indicated by the period P2 shown in FIG. 3). It is noted that, the filtering circuit 200 can finish the calibration of the center frequency before the phase-locked loop PLL finishes locking the frequency, and therefore, the oscillating signal generation circuit 10 can select the center frequency of the filtering circuit 200 dynamically and rapidly without occupying the operation time of the system.

What is claimed is:

1. A filtering circuit, comprising:
   a filter, configured to generate a first oscillating signal according to a control signal in a first mode, and perform a filtering process according to the control signal in a second mode, wherein a frequency of the first oscillating signal is determined according to the control signal;
   a frequency divider, coupled to the filter and configured to divide the frequency of the first oscillating signal to generate a frequency-divided signal; and
   a control circuit, coupled to the filter and the frequency divider, and configured to compare a frequency of the frequency-divided signal and a frequency of a second oscillating signal so as to adjust the control signal in the first mode, wherein a center frequency of a passband of the filter in the second mode is determined according to the adjusted control signal,
   wherein the filter is configured to receive an input signal in the second mode, and perform the filtering process on the input signal according to the passband, and the input signal is uncoupled from the filter in the first mode.

2. The filtering circuit of claim 1, wherein
   when the frequency of the frequency-divided signal is greater than the frequency of the second oscillating signal, the control circuit is configured to adjust the control signal, so as to decrease the frequency of the first oscillating signal outputted by the filter, and
   when the frequency of the frequency-divided signal is smaller than the frequency of the second oscillating signal, the control circuit is configured to adjust the control signal, so as to increase the frequency of the first oscillating signal outputted by the filter.

3. The filtering circuit of claim 1, wherein the filter performs the filtering process on the input signal in the second mode to generate an output signal, wherein the filter comprises:
   an output terminal;
   a frequency selection circuit, coupled to the output terminal and configured to set the frequency of the first oscillating signal according to the control signal in the first mode, and set the center frequency of the passband according to the control signal in the second mode;
   an oscillation-starting circuit, coupled to the output terminal and configured to provide a first current to the frequency selection circuit through the output terminal in the first mode, so as to generate the first oscillating signal at the output terminal; and
   an amplifier circuit, coupled to the output terminal and configured to provide a second current to the frequency selection circuit through the output terminal in the second mode, so as to amplify the input signal and to generate at least a portion of the output signal at the output terminal.

4. The filtering circuit of claim 3, wherein,
   in the first mode, a current value of the first current is greater than a threshold value, and the oscillation-starting circuit is in an oscillating state so as to generate the first oscillating signal at the output terminal, and
   in the second mode, the current value of the first current is smaller than the threshold value, and the oscillation-starting circuit is in a non-oscillating state so as to generate an another portion of the output signal at the output terminal.

5. The filtering circuit of claim 3, wherein the oscillation-starting circuit comprises:
   a first current source, configured to provide the first current; and
   a cross-coupling transistor pair, coupled between the output terminal and the first current source, and configured to generate the first oscillating signal at the output terminal according to the first current in the first mode.

6. The filtering circuit of claim 3, wherein the amplifier circuit is further configured to stop providing the second current in the first mode.

7. The filtering circuit of claim 3, wherein the amplifier circuit comprises:
   a second current source, configured to generate the second current in the second mode; and
   a first transistor and a second transistor, respectively coupled between the output terminal and the second current source, and configured to amplify the input signal as the output signal according to the second current, wherein a frequency of the output signal falls within the passband.

8. The filtering circuit of claim 7, wherein the first transistor and the second transistor are both switched off in the first mode.

9. The filtering circuit of claim 1, wherein the filter performs the filtering process on the input signal to generate an output signal in the second mode, and the filtering circuit further comprises:
   an input switch, selectively coupled between the input signal and the filter, wherein the input switch is configured to be switched off in the first mode and to be conducted in the second mode.

10. The filtering circuit of claim 1, wherein the filter performs the filtering process on the input signal in the second mode to generate an output signal, wherein a frequency of the output signal is substantially identical to the frequency of the first oscillating signal generated by the filter according to the adjusted control signal.

11. An oscillating signal generation circuit, comprising:
    a filtering circuit, configured to generate a first oscillating signal in a first mode, receive a second oscillating signal to adjust a frequency of the first oscillating signal, and perform a filtering process on an input signal to generate an output signal in a second mode, wherein a center frequency of a passband of the filtering circuit is determined according to the frequency of the adjusted first oscillating signal; and
    an oscillator circuit, coupled to the filtering circuit and configured to receive the second oscillating signal to generate the input signal,
    wherein the input signal is uncoupled from the filtering circuit in the first mode.

12. The oscillating signal generation circuit of claim 11, further comprising:
an input switch, selectively coupled between the oscillator circuit and the filtering circuit, and configured to be switched off in the first mode and to be conducted in the second mode.

13. The oscillating signal generation circuit of claim 11, further comprising:
an oscillating signal generator circuit, configured to modulate the output signal in the second mode; and
an output switch, selectively coupled between the oscillating signal generator circuit and the filtering circuit, and configured to be switched off in the first mode and to be conducted in the second mode.

14. The oscillating signal generation circuit of claim 11, wherein the filtering circuit comprises:
a filter, configured to generate the first oscillating signal in the first mode and generate the output signal in the second mode;
a frequency divider, configured to divide the frequency of the first oscillating signal to generate a frequency-divided signal; and
a control circuit, configured to compare the frequency-divided signal and the second oscillating signal so as to generate a control signal,
wherein the filter is further configured to adjust the frequency of the first oscillating signal according to the control signal.

15. The oscillating signal generation circuit of claim 14, wherein,
when a frequency of the frequency-divided signal is greater than a frequency of the second oscillating signal, the control circuit is configured to adjust the control signal, so as to decrease the frequency of the first oscillating signal outputted by the filter, and
when the frequency of the frequency-divided signal is smaller than the frequency of the second oscillating signal, the control circuit is configured to adjust the control signal, so as to increase the frequency of the first oscillating signal outputted by the filter.

16. The oscillating signal generation circuit of claim 14, wherein the filter comprises:
a frequency selection circuit, configured to set the frequency of the first oscillating signal according to the control signal in the first mode, and set the center frequency of the passband according to the control signal in the second mode;
an oscillation-starting circuit, configured to provide a first current to the frequency selection circuit, so as to generate the first oscillating signal in the first mode and generate a first portion of the output signal in the second mode; and
an amplifier circuit, configured to provide a second current to the frequency selection circuit in the second mode, so as to amplify the input signal and generate a second portion of the output signal.

17. The oscillating signal generation circuit of claim 16, wherein the oscillation-starting circuit comprises:
a first current source, configured to provide the first current;
a cross-coupling transistor pair, configured to generate the first oscillating signal according to the first current in the first mode.

18. The oscillating signal generation circuit of claim 17, wherein the first current in the first mode is greater than the first current in the second mode.

19. The oscillating signal generation circuit of claim 16, wherein the amplifier circuit comprises:
a second current source, configured to generate the second current in the second mode; and
a first transistor and a second transistor, configured to receive the input signal, and amplify the input signal as the output signal according to the second current, wherein a frequency of the output signal falls within the passband.

20. The oscillating signal generation circuit of claim 18, wherein the second current source is switched off in the first mode.

* * * * *